United States Patent
Brodsky

(10) Patent No.: US 7,321,978 B2
(45) Date of Patent: Jan. 22, 2008

(54) OVERCLOCK DETECTION

(75) Inventor: Franklin D. Brodsky, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 385 days.

(21) Appl. No.: 11/014,120

(22) Filed: Dec. 15, 2004

(65) Prior Publication Data

US 2006/0129867 A1 Jun. 15, 2006

(51) Int. Cl.
*G06F 1/08* (2006.01)
(52) U.S. Cl. .................. 713/500; 714/10; 714/814
(58) Field of Classification Search ............... 713/500; 714/10, 814
See application file for complete search history.

(56) References Cited

U.S. PATENT DOCUMENTS

| 5,610,561 | A | * | 3/1997 | Zarrabian | ............... 331/49 |
| 6,535,988 | B1 | * | 3/2003 | Poisner | ............... 713/500 |
| 2006/0107083 | A1 | * | 5/2006 | Brown | ............... 713/600 |

* cited by examiner

*Primary Examiner*—Thuan Du
(74) *Attorney, Agent, or Firm*—Caven & Aghevli LLC

(57) ABSTRACT

An overclock detector may define a plurality of detection periods based upon a reference clock signal. Further, the overclock detector may activate an overclock response in response to determining an operating clock signal generating too many cycles in each of a plurality of consecutive detection periods.

18 Claims, 8 Drawing Sheets

1

OVERCLOCK DETECTION

BACKGROUND

Manufacturers may perform various tests to rate each processor for a particular clock frequency. Based on these tests, the manufacturer may determine the maximum clock frequency at which the processor may operate without errors. However, many manufacturers conservatively rate their processors in order to introduce further safety margin of error. For example, a processor that successfully operates during tests at 3 GHz may be rated at only 2.8 GHz.

Moreover, consumers demand processors across a wide variety of clock frequencies. As a result, manufacturers typically rate processors at frequencies that are significantly lower than the processor's maximum clock frequency to meet consumer demand. For example, 80% of a manufacturer's processors may operate correctly at 3 GHz. However, the manufacturer may mark and rate these 3 GHz processors as slower processors (e.g. 2.4, 2.6, and 2.8 GHz) to satisfy market demand.

Because many processors may be clocked at frequencies significantly greater than their rated (marked) clock frequency, resellers and distributors may remark processors with a higher frequency and may resell the remarked processors as the higher speed part at a higher price. Further, computer manufacturers and consumers may configure their systems to operate a processor at a higher clock frequency than originally rated. This operating a processor at a higher clock frequency is commonly referred to as overcocking and may result in a substantial cost savings to computer manufacturers and consumers at the expense of a processor manufacturer attempting to meet market demand for lower rated processors.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

DETAILED DESCRIPTION

Figure 1:
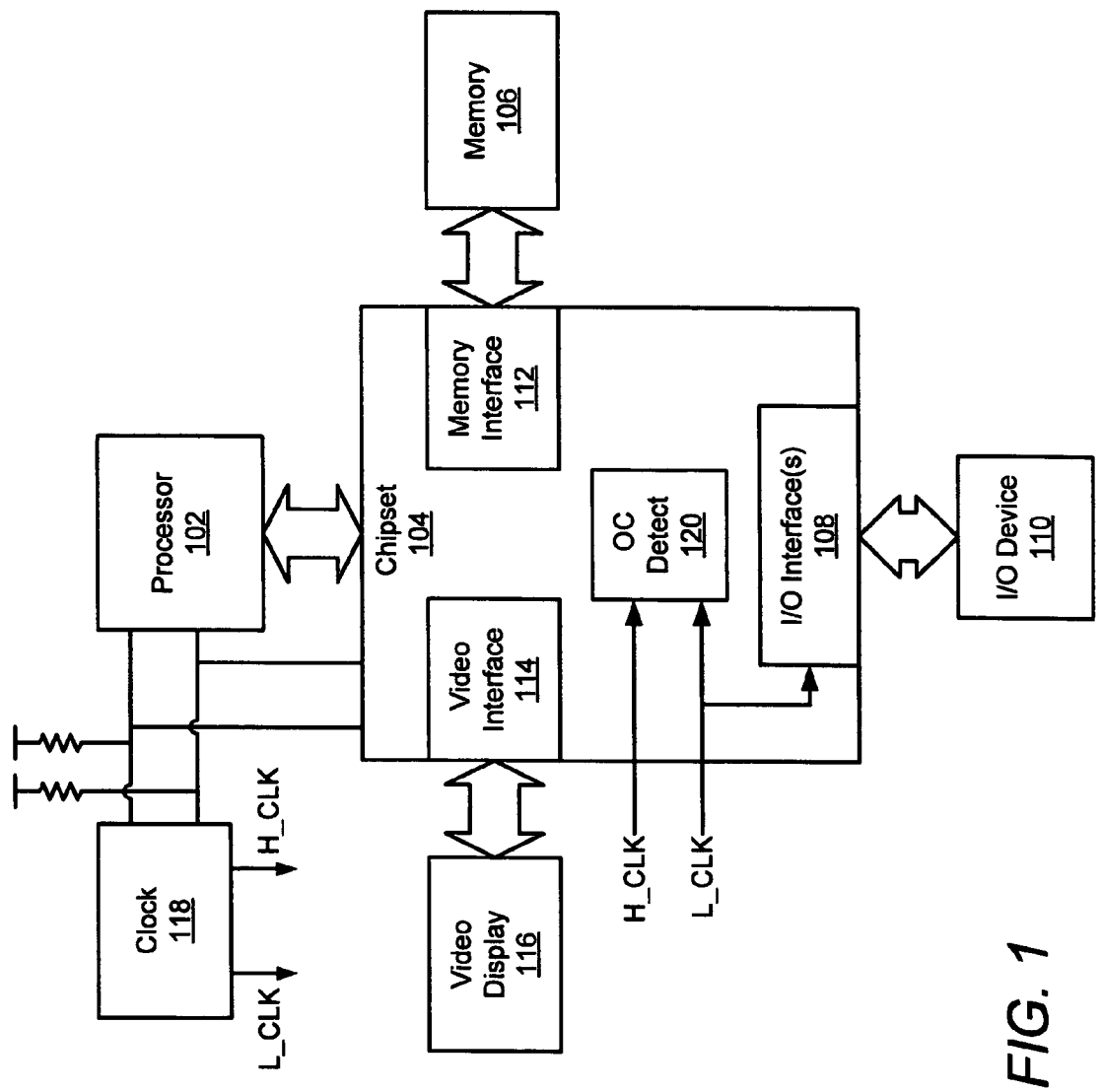
FIG. 1 illustrates an embodiment of a computing device with an overclock detector.

The following description describes techniques and arrangements to detect overcocking. In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

The following description further describes signals as being activated, deactivated, in an active state, or in a inactive state. It should be understood that such terminology is referring to a "logical" status of the signal and is not referencing the underlying electrical nature of the signal. For example, a reset signal may be activated to indicate a reset condition and deactivated to indicate a non-reset condition. The underlying electrical nature of an activated reset signal may however be a high signal, a low signal, a positive differential signal, a negative differential signal, or some other signal encoding mechanism.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

An embodiment of a computing device is shown in FIG. 1. The computing device may comprise one or more processors 102 and a chipset 104. The chipset 104 may include one or more integrated circuit packages or chips that couple the processor 102 to a memory 106. The chipset 104 may further couple the processor 102 to other components. In one embodiment, the chipset 104 may comprise an I/O interface 108 to connect I/O devices 110 to the processor 102 and/or memory 106. For example, the chipset 104 may comprise a PCI (Peripheral Component Interconnect) interface, PCI Express interface, USB (Universal Serial Bus) interface, and/or some other interface that operatively connect keyboards, mice, storage devices, audio devices, etc. to the processor 102 and/or memory 106.

The chipset 104 may further comprise a memory interface 112 to read from and/or write data to the memory 106 in response to read and write requests of the processor 102 and/or other components of the computing device. The memory 106 may comprise one or more memory devices that provide addressable storage locations from which data may be read and/or to which data may be written. The memory 106 may also comprise one or more different types of memory devices such as, for example, DRAM (Dynamic Random Access Memory) devices, SDRAM (Synchronous DRAM) devices, DDR (Double Data Rate) SDRAM devices, or other volatile and/or non-volatile memory devices.

The chipset 104 may further comprise a video interface 114 for a display 116. In one embodiment, the video interface 114 may generate analog display signals suitable for display by an analog display 116 such as, for example, a VGA (Video Graphics Array) CRT (cathode ray tube) monitor. The video interface 114 may also generate digital display signals suitable for display by a digital display 116 such as, for example, a DVO (Digital Video Output) or SDVO (serial DVO) flat panel display.

As shown, the computing device may also include a clock 118. In one embodiment, the clock 118 may generate a reference clock signal L_CLK having a fixed frequency such as, for example, 250 MHz. The clock 118 may provide its reference clock signal L_CLK to the chipset 104 to drive one or more I/O interfaces 108 of the chipset 104 such as, for example, a PCI Express interface. In one embodiment, the PCI Express interface requires a reference clock signal with a 250 MHz frequency in order to generate signals in compliance with the PCI Express Base Specification, Revision 1.0 of Jul. 22, 2002. As a result, the chipset 104 may use the reference clock signal L_CLK as a basis for detecting overclocking of the computing device since the chipset 104 may reasonably expect the reference clock signal L_CLK to maintain a frequency of 250 MHz.

The clock 118 may further generate a processor or operating clock signal H_CLK that defines the operating rate of the processor 102 and/or some other components of the computing device. The clock 118 may generate the operating clock signal H_CLK with a selectable or programmable frequency. In particular, the clock 118 may comprise select lines BSEL0, BSEL1 to select the frequency of the operating clock signal H_CLK. The status of the select lines BSEL0, BSEL1 may select a frequency for the operating clock signal H_CLK from a group of supported clock frequencies (e.g. 100 MHz, 133 MHz, 200 MHz) and may configure the processor 102 and chipset 104 to operate based upon the selected frequency. Further, the operating clock signal H_CLK generated by the clock 118 may drive the processor 102, portions of the chipset 104, and/or other subsystems of the computing device at the selected frequency.

Also as depicted, the chipset 104 may include an overclock detector 120. The overclock detector 120 may detect whether the processor 102 and/or other components are operating faster than desired. In one embodiment, the overclock detector 120 may detect whether the processor 102 and/or other components of the computing device are being overclocked or driven beyond supported operating frequencies or beyond licensed ratings. The overclock detector 120 may detect such an overclock condition based upon the reference clock signal L_CLK and the operating clock signal H_CLK. In particular, the overclock detector 120 may determine that an overclock condition has occurred in response to determining that the operating clock signal H_CLK has more cycles than allowed for multiple detection periods.

Figure 2:
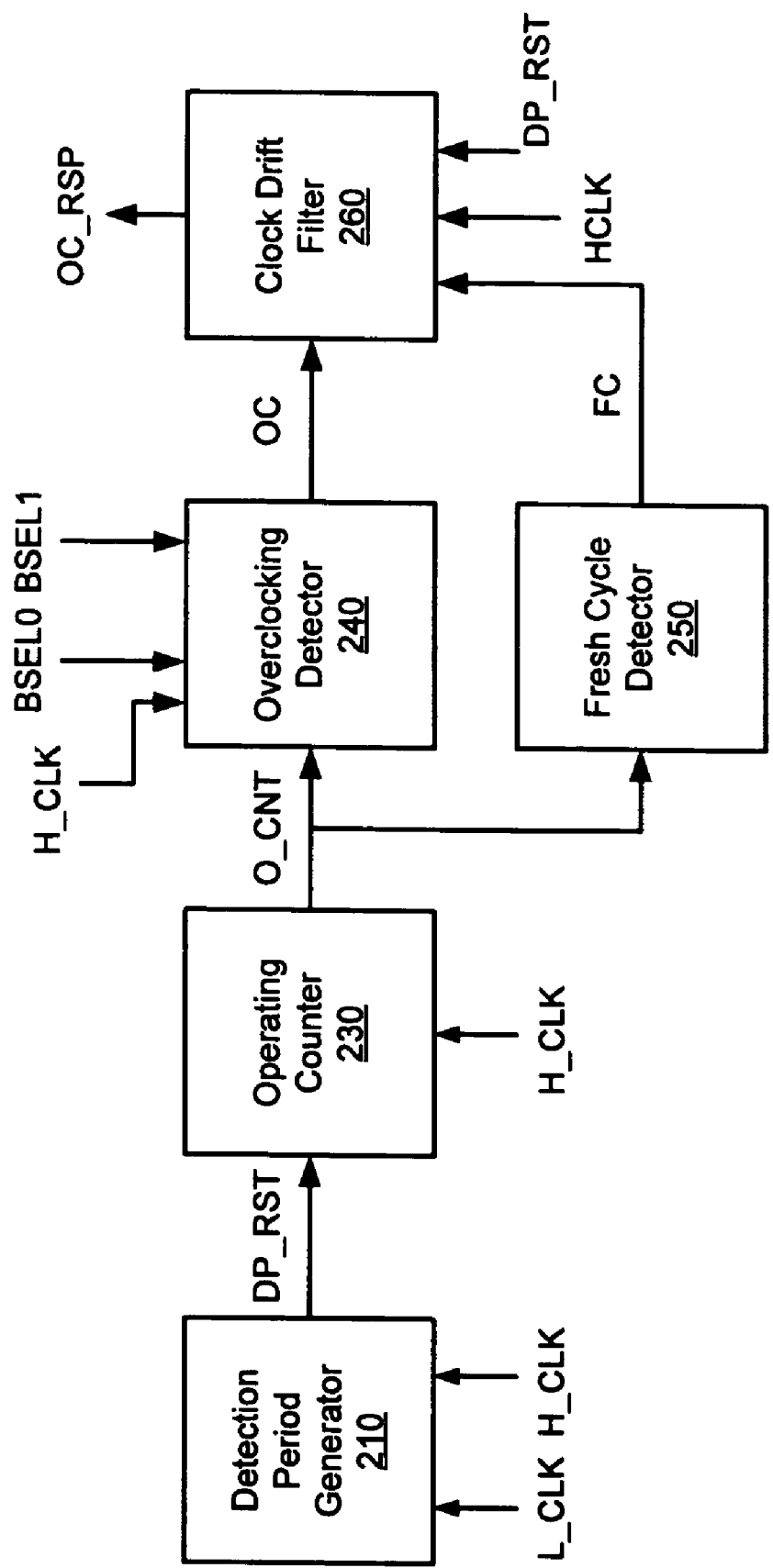
FIG. 2 illustrates an embodiment of the overclock detector of FIG. 1.

One embodiment of the overclock detector 120 is depicted in FIG. 2. As depicted, the overclock detector 120 may comprise a detection period generator 210, an operating counter 230, an overclocking detector 240, a fresh cycle detector 250, and clock drift filter 260. The detection period generator 210 may periodically activate a detection period reset signal DP_RST based upon a detection period defined by the reference clock signal L_CLK. The detection period generator 210 may further activate the detection period reset signal DP_RST such that the transitions of the detection period reset signal DP_RST are synchronized with transitions of the operating clock signal H_CLK.

The operating counter 230 may generate an operating count signal O_CNT that is indicative of the number of cycles of operating clock signal H_CLK that have occurred during a detection period defined by the detection period reset signal DP_RST. In one embodiment, the operating counter 230 may increment its operating count O_CNT in response to each clock cycle of the operating clock signal H_CLK. Further, the operating counter 230 may reset the operating count O_CNT in response to the detection period generator 210 activating the detection period reset signal DP_RST.

The overclocking detector 240 may select a threshold based upon the status of the select lines BSEL0, BSEL1. Further, the overclocking detector 240 may activate an overclocking signal OC to indicate that the operating clock signal H_CLK is operating faster than allowed by the selected threshold. The fresh cycle detector 250 may activate a fresh cycle signal FC to indicate the overclocking detector 240 has begun a fresh cycle.

The clock drift filter 260 may activate an overclocking response signal OC_RSP to initiate an overclock response. In particular, the clock drift filter 260 may filter the overclocking signal OC generated by the overclocking detector 240 to prevent an overclock response due to brief changes in the operating clock frequency that may be due to clock drift or other reasons.

Figure 3:
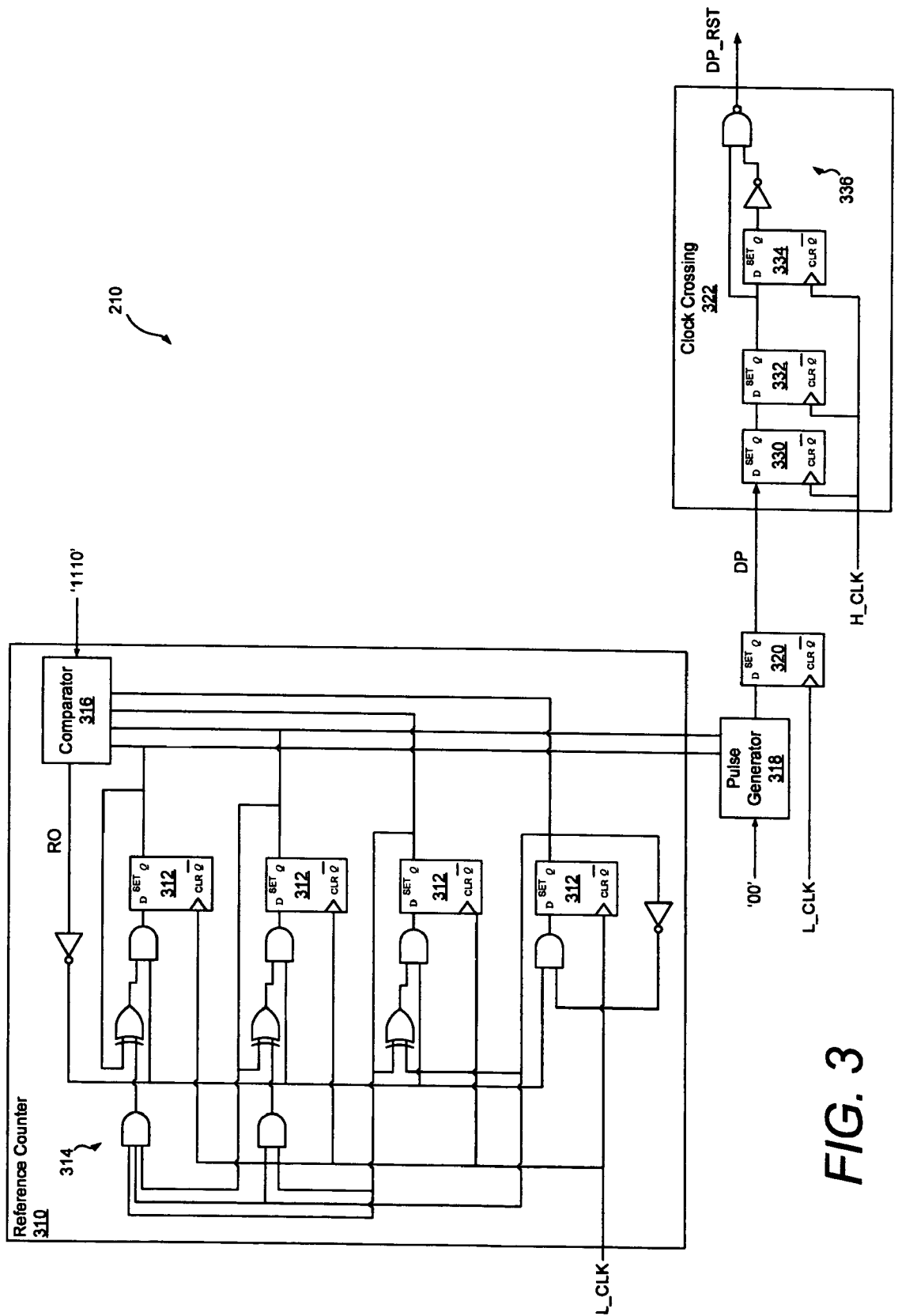
FIG. 3 illustrates an embodiment of the detection period generator of the overclock detector shown in FIG. 2.

Referring now to FIG. 3, an embodiment of the detection period generator 210 is depicted. The detection period generator may comprise a 4-bit reference counter 310 having four D flip-flops 312 to store a 4-bit count. The 4-bit reference counter 310 may comprise logic circuitry 314 such as AND gates, XOR gates, OR gates, and NOT gates that cause the D flip-flops 312 to increment the stored reference count R_CNT by one in response to each rising edge of the reference clock signal L_CLK. Moreover, the reference counter 310 may comprise a comparator 316 to activate a roll-over signal RO that causes the D flip-flops 312 to roll-over or reset to a reference count R_CNT of 0 (0000 binary). The comparator 310 may activate the roll-over signal RO in response to the reference count R_CNT of the reference counter 310 having a predetermined relationship to a roll-over value. In particular, the comparator 316 may activate the roll-over signal RO in response to the reference count R_CNT being equal to 14 (1110 binary).

Figure 6:
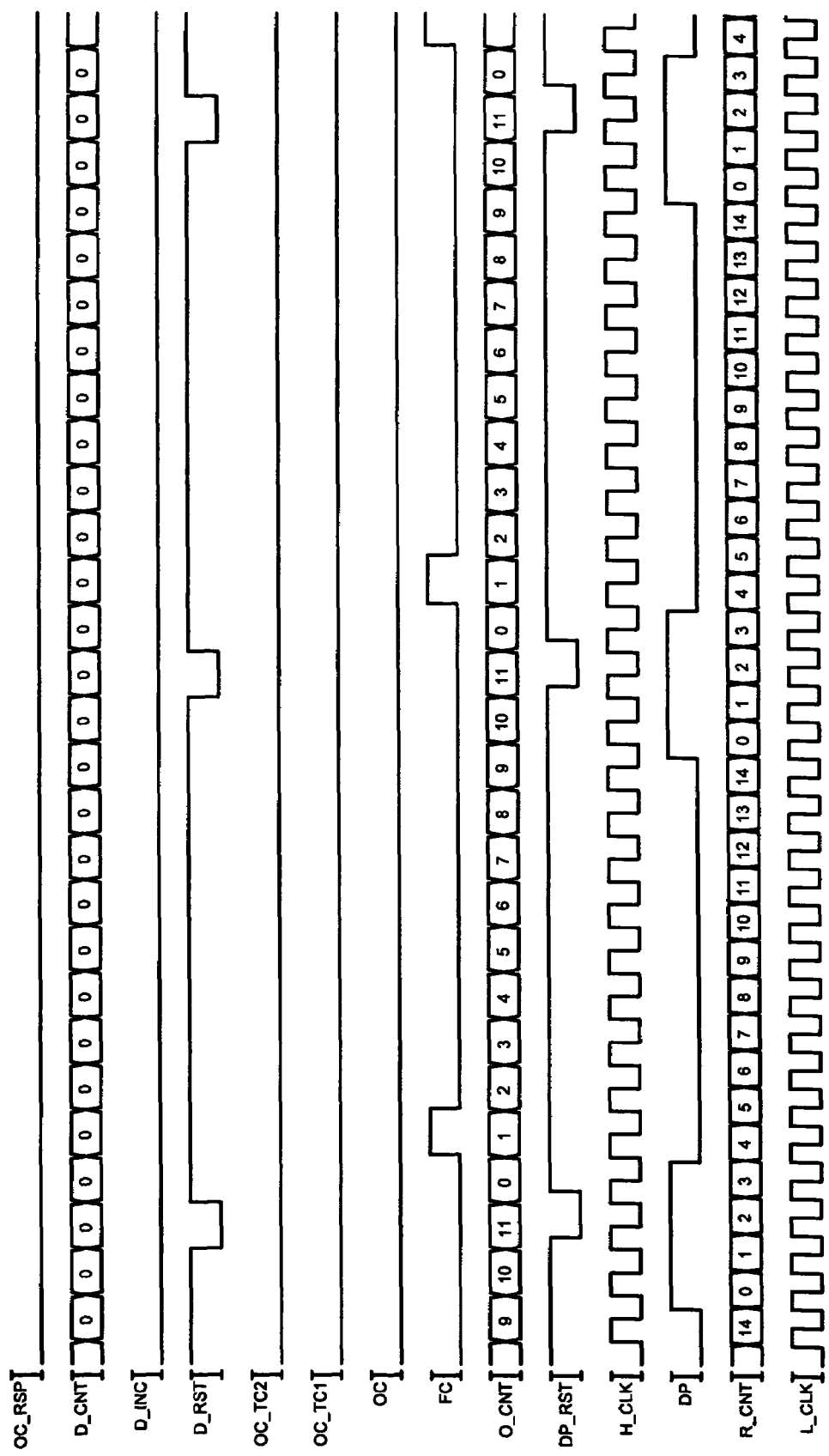
FIG. 6 illustrates a signal diagram of the overclock detector of FIG. 2 in response to an operating clock signal that is not being overclocked.
Figure 7:
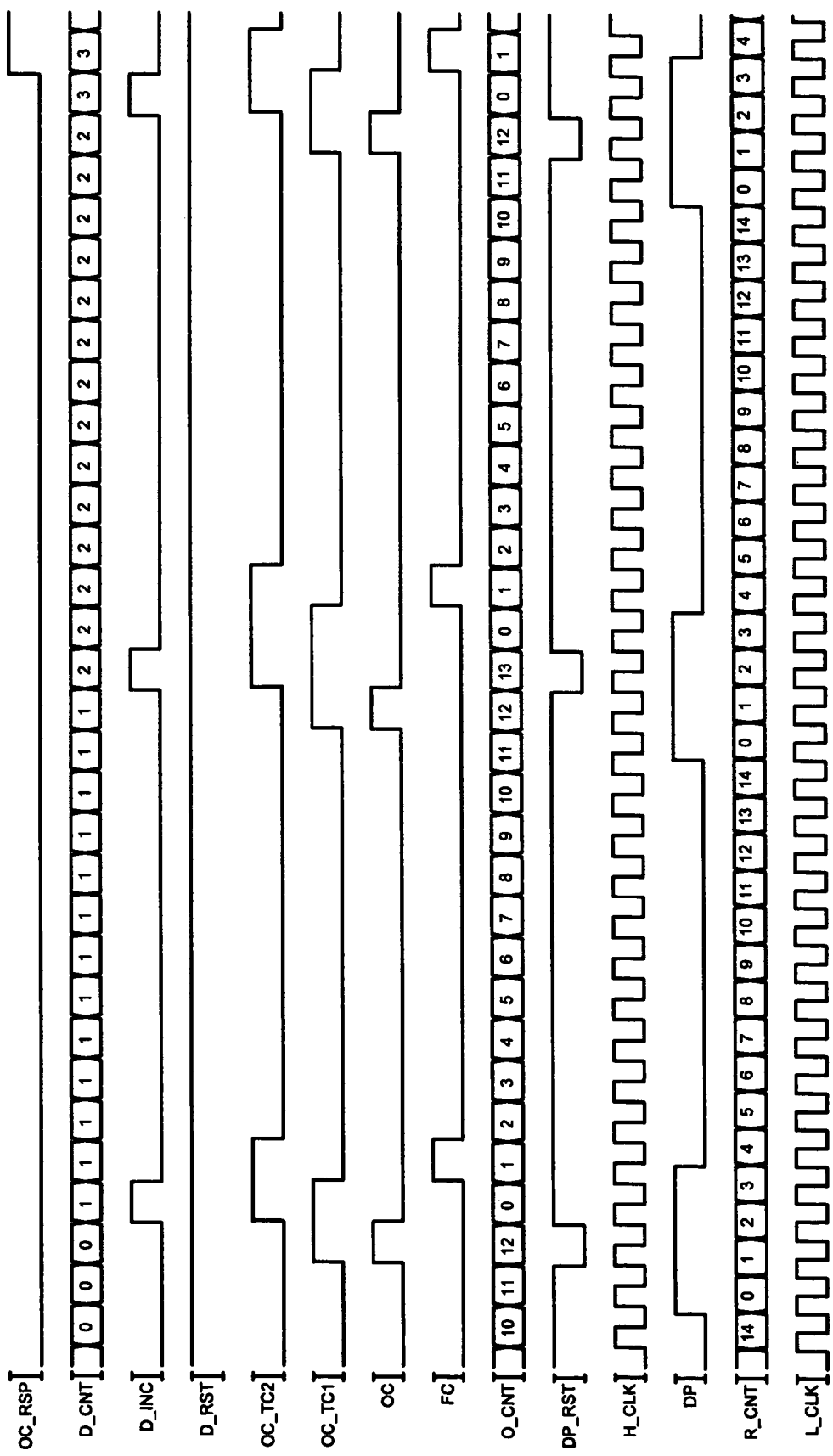
FIG. 7 illustrates a signal diagram of the overclock detector of FIG. 2 in response to an operating clock signal that is being overclocked.
Figure 8:
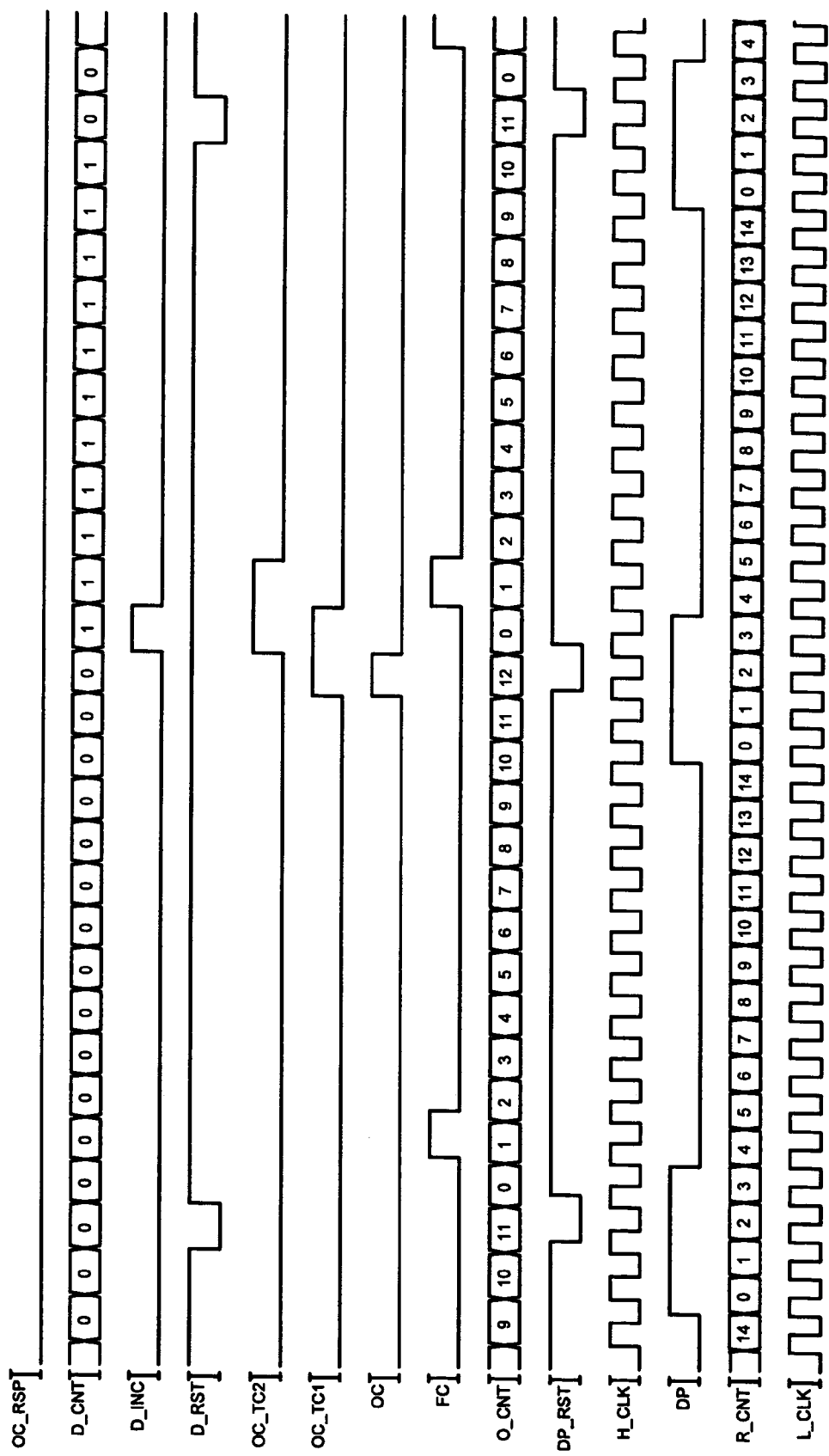
FIG. 8 illustrates a signal diagram of the overclock detector of FIG. 2 in response to an operating clock signal that is not being overclocked but is experiencing clock drift.

Due to the above configuration, the reference counter 310 in one embodiment cyclically increments its reference count R_CNT from 0 to 14 in response to each rising edge of the reference clock signal L_CLK. Accordingly, if the reference clock signal L_CLK has a frequency of 250 MHz, then reference count R_CNT rolls over every 60 nanoseconds (ns) or 15 cycles of the reference clock signal L_CLK. The signal diagrams of FIGS. 6-8 depict the reference count R_CNT cycling from 0 to 14 in response to rising edges of the reference clock signal L_CLK.

As depicted, the detection period generator 210 may further comprise a pulse generator 318 to generate a pulse signal having one pulse each roll-over cycle of the reference counter 310. The detection period generator 210 may further comprise a D flip-flop 320 to capture the state of the pulse signal in response the rising edge of the reference clock signal L_CLK and present the detection period signal DP which represents the pulse signal synchronized with the referenced clock signal L_CLK.

In one embodiment, the pulse generator 318 may generate the pulse with a width that covers multiple cycles of the reference clock signal L_CLK so that the detection period signal DP may be reliably transferred to the operating clock domain. In particular, since the reference clock signal L_CLK and the operating clock signal H_CLK may operate in an asynchronous manner, the pulse of the detection period signal DP should last for at least two cycles of the slowest supported frequency of the operating clock signal H_CLK. In one embodiment, the reference clock signal L_CLK is 250 MHz (4 ns/cycle) and the slowest operating clock signal H_CLK has a frequency of 133 MHz (about 7.52 ns/cycle), thus two cycles of the slowest H_CLK is roughly 15.04 ns and four cycles of the L_CLK is about 16 ns. Thus, the pulse generator 318 may generate a pulse having a width of at least four cycles of the reference clock signal L_CLK in order for the pulse of the detection period signal DP to be reliably transferred to the operating clock signal H_CLK domain.

To this end, the pulse generator 218 in one embodiment comprises a comparator that generates an active signal when the two most significant bits of the reference count R_CNT are equal to 0 ('00' binary). Accordingly, the pulse generator 218 generates an active signal when the reference count R_CNT is equal to 0, 1, 2, and 3 as depicted by the detection period signal DP in FIGS. 6-8.

Still referring to FIG. 3, the detection period generator 210 may also include a clock crossing circuit 322. The clock crossing circuit 322 may receive the detection period signal DP from the reference clock signal L_CLK domain and may generate therefrom a detection period reset signal DP_RST in the operating clock domain H_CLK. In particular, the clock crossing circuit 322 may comprise two D flip-flops 330, 332 that reliably capture the pulse of the detection period signal DP in response to rising edges of the operating clock signal H_CLK. Further, the clock crossing circuit 322 may comprise another D flip-flop 334 and supporting logic 336 such as, for example, a NAND gate and a NOT gate that cause the D flip-flop 334 to detect the rising edge of the captured pulse. Further, the D flip-flop 334 and logic 336 may generate the detection period signal DP_RST with a pulse that goes low for one cycle of the operating clock signal H_CLK in response to each detected rising edge of the detection period signal as depicted by the detection period reset signal DP_RST in FIGS. 6-8.

Figure 4:
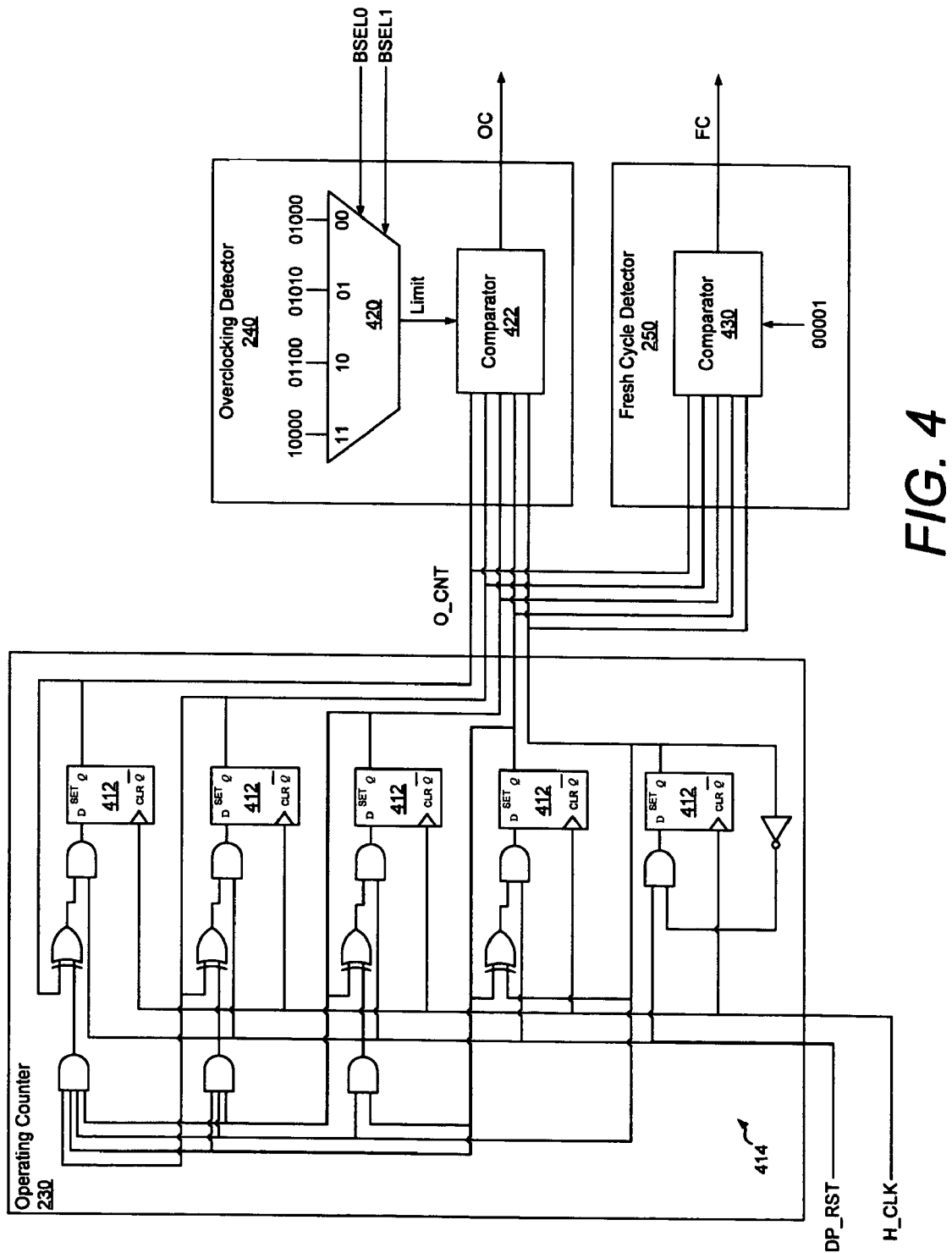
FIG. 4 illustrates an embodiment of the operating counter, overclocking detector, and fresh cycle detector of the overclock detector shown in FIG. 2.

An embodiment of the operating counter 230, the overclocking detector 240, and the fresh cycle detector 250 is shown in FIG. 4. The operating counter 230 may further comprise a 5-bit counter having five D flip-flops 412 to store a 5-bit operating count O_CNT. The 5-bit operating counter 230 may comprise logic circuitry 414 such as AND gates, XOR gates, OR gates, and NOT gates that cause the D flip-flops 412 to increment the stored operating count O_CNT by one in response to each rising edge of the operating clock signal H_CLK. Moreover, the logic circuitry 414 may cause the D flip-flops 412 to roll-over to an operating count O_CNT of 0 (00000 binary) from an operating count O_CNT of 31 (11111 binary). Further, the logic circuitry 414 may reset the operating count O_CNT to 0 (00000 binary) when the detection period reset signal DP_RST is activated (e.g. 0). In one embodiment, the detection period generator 210 activates the detection period reset signal DP_RST (e.g. force to 0) for one clock cycle of the operating clock signal H_CLK every 60 ns. Accordingly, the operating counter 230 in one embodiment is reset to an operating count O_CNT of 0 every 60 ns by the detection period reset signal DP_RST as shown in FIGS. 6-8.

The overclocking detector 240 may determine whether the operating clock signal H_CLK is operating at a frequency greater than desired and/or licensed. In one embodiment, the overclocking detector 240 may comprise a multiplexer 420 and a comparator 422. The multiplexer 420 may select an operating count limit based upon the status of the select lines BSEL0, BSEL1. In one embodiment, select lines BSEL0, BSEL1 of 0 corresponds to an operating frequency of 133 MHz (about 7.5 ns/cycle) or about 8 cycles per every detection period of 60 ns. Similarly, select lines BSEL0, BSEL1 of 1 corresponds to an operating frequency of 167 MHz (about 6 ns/cycle) or about 10 cycles per every 60 ns, of 2 corresponds to an operating frequency of 200 MHz (about 5 ns/cycle) or about 14 cycles per every 60 ns, and of 3 corresponds to an operating frequency of 267 MHz (about 3.75 ns/cycle) or about 16 cycles every 60 ns. As a result, the multiplexer 420 in one embodiment is configured to respectively select limits of 8, 10, 14, and 16 in response to select lines BSEL0, BSEL1 of 0, 1, 2, and 3.

The comparator 422 may activate the overclocking signal OC in response to the operating count O_CNT having a predetermined relationship to (e.g. equal to) the selected limit and may deactivate the overclocking signal otherwise. For example, FIG. 6 shows a non-overclocking situation for an operating clock signal of 200 MHz. As illustrated, the operating count O_CNT never reaches a count of 12. Thus, the operating clock signal H_CLK does not generate more than 12 cycles during the 60 ns detection period. Conversely, FIG. 7 shows a situation where an operating clock signal H_CLK is overclocked beyond the expected frequency of 200 MHz. Accordingly, the operating count O_CNT reaches a count of 12 or higher during each 60 ns detection period.

Figure 5:
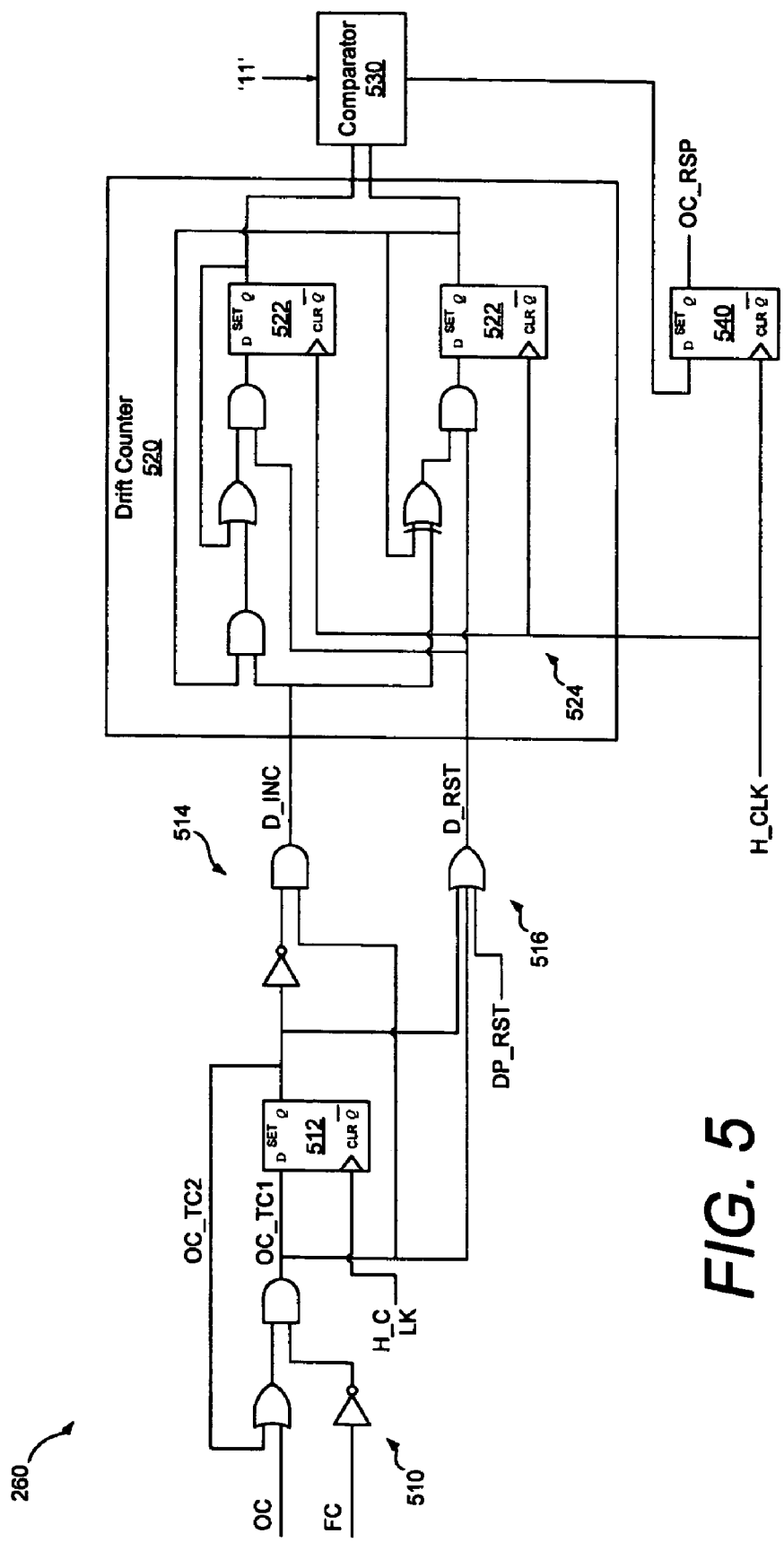
FIG. 5 illustrates an embodiment of the clock drift filter of the overclock detector shown in FIG. 2.

Referring now to FIG. 5, an embodiment of clock drift filter 260 is depicted. The clock drift filter 260 may filter the overclocking signal OC to prevent activating the overclocking response signal OC_RSP due to deviations in the frequency of the operating clock signal H_CLK that are unlikely a result of someone intentionally overclocking the operating clock signal H_CLK. In one embodiment, the clock drift filter 260 may comprise logic circuitry 510 and a D flip-flop 512 that generate a first overclocking this cycle signal OC_TC1 and a second overclocking this cycle signal OC_TC2. In particular, the logic circuitry 510 may activate the first overclocking this cycle signal OC_TC1 in response to the overclocking signal OC or the second overclocking this cycle signal OC_TC2 being active. Further, the logic circuitry 510 may deactivate the first overclocking this cycle signal OC_TC1 in response to the fresh cycle signal FC being activated. The D flip-flop 512 may store the status of the first overclocking this cycle signal OC_TC1 in response to a rising edge of the operating clock signal H_CLK.

Further, the D flip-flop 512 may generate the second overclocking signal OC_TC2 such that it represents the stored status of the first overclocking signal OC_TC1.

As shown in the non-overclocking diagram of FIG. 6, the overclocking this cycle signals OC_TC1, OC_TC2 remain in an inactive state since the operating clock signal H_CLK is not overclocked and the overclocking signal OC remains in an inactive state. However, as shown in the overclocking diagram of FIG. 7, the overclocking this cycle signals OC_TC1, OC_TC2 are activated in response to the overclocking signal OC being activated and are deactivated in response to the fresh cycle signal FC being activated.

The clock drift filter 260 may further include logic circuitry 514 such as, for example, a NOT gate and an AND gate that in conjunction with the D flip-flop 512 may detect a rising edge of the second overclocking this cycle signal OC_TC2. Further, the D flip-flop 512 and logic circuitry 514 may further activate a drift increment signal D_INC for one cycle of the operating clock H_CLK in response to detecting the rising edge. As shown in the non-overclocking diagram of FIG. 6, the drift increment signal D_INC may remain in an inactive state since the overclocking this cycle signals OC_TC1, OC_TC2 are not activated. However, in the overclocking diagrams of FIG. 7, the drift increment signal D_INC is activated in response to each rising edge of the second overclocking this cycle signal OC_TC2.

The clock drift filter 260 may also include logic circuitry 516 such as, for example, an OR gate that activates a drift reset signal D_RST in response to the overcocking this cycle signals OC_TC1, OC_TC2 being deactivated and the detection period reset signal DP_RST being activated. As shown, in the non-overclocking diagram of FIG. 6, the drift reset signal D_RST is activated (e.g. forced low) in response to the detection period reset signal DP_RST being active (e.g. low) and the overcocking this cycle signals OC_TC1, OC_TC2 being deactivated (e.g. low). In the overclocking diagram of FIG. 7, however, the drift reset signal D_RST remains in an inactive state (e.g. high) since the first overclocking this cycle signal OC_TC1 is active when the detection period reset signal DP_RST is active.

The clock drift filter 260 may further comprise a 2-bit drift counter 520 having two D flip-flops 522 to store a 2-bit drift count D_CNT. The drift counter 520 may also comprise logic circuitry 524 such as AND gates, XOR gates, and OR gates that cause the D flip-flops 522 to increment the stored drift count D_CNT by one in response to each rising edge of the operating clock signal H_CLK that occurs when the drift increment signal D_INC is active. Moreover, the logic circuitry 524 may reset the drift count D_CNT to 0 (00 binary) when the drift reset signal D_RST is active (e.g. low). In one embodiment, the logic circuitry 516 essentially activates (e.g. forces low) the drift reset signal D_RST at least once each non-overclocked cycle of the operating counter 230.

As depicted in the non-overclocking diagram of FIG. 6, the drift count D_CNT remains a 0 since the drift increment signal D_INC remains inactive. However, in the overclocking diagram of FIG. 7, the drift count D_CNT increments from 0 to 3 in response to the drift increment signal D_INC. FIG. 8 depicts a non-overclocking situation wherein the operating clock signal H_CLK incurs an extra cycle during a detection period. As a result, the drift count D_CNT is incremented to 1 in response to the extra cycle causing activation of the drift increment signal D_INC. However, the operating clock signal H_CLK incurs only the allotted number of cycles during the subsequent detection period. The drift count D_CNT is therefore reset to 0 by the activation of the drift reset signal D_RST.

The clock drift filter 260 may further include a comparator 530 to compare the drift count D_CNT to a drift threshold. The clock drift filter 260 may also include a D flip-flop 540 to capture the status of the comparator 530. Further, the D flip-flop 540 may activate an overclocking response signal OC_RSP in response to the captured status of the comparator 530. In particular, the comparator 530 may generate an active signal in response to the drift count D_CNT having a predetermined relationship to (e.g. equal to) a drift threshold (e.g. 3). Therefore, in one embodiment, the D flip-flop 540 may activate the overclocking response signal OC_RSP in response to the drift count D_CNT being equal to 3 ('11' binary). In such an embodiment, the clock drift filter 260 may filter out the overclocking signal OC when indicative of brief or intermittent changes in the frequency of the operating clock signal H_CLK as depicted in FIG. 8. Further, the clock drift filter 260 may activate the overclocking response signal OC_RSP when the overclocking signal OC is indicative of purposeful overclocking such as when the overclocking is detected for three successive detection periods as depicted in FIG. 7.

The computing device may take various actions in response to the overclocking response signal OC_RSP being activated. For example, the computing device may force a system shutdown or a system reboot. In another embodiment, the computing device may activate a throttling mechanism that lowers the frequency of the operating clock H_CLK or lowers the effective performance of the computing device. In yet another embodiment, the computing device may halt the processor thus stopping the computing device.

Certain features of the invention have been described with reference to example embodiments. However, the description is not intended to be construed in a limiting sense. Various modifications of the example embodiments, as well as other embodiments of the invention, which are apparent to persons skilled in the art to which the invention pertains are deemed to lie within the spirit and scope of the invention. For example, the counters 230, 310, 520 may be implemented with a different number of bits and/or to update their counts by decrementing. Further, logic may be inversed (e.g. active high signals may become active low signals) and signal names be changed without departing from the spirit and scope of the invention as claimed.

What is claimed is:

1. A method comprising defining a plurality of detection periods based upon a reference clock signal;
    generating an operating count of an operating clock signal for each detection period of the plurality detection periods, and
    determining that the operating clock signal is being overclocked in response to the operating count having a predetermined relationship to a threshold for at least a predetermined number of consecutive detection periods,
    wherein defining the detection period comprises:
       generating a reference count based upon the reference clock signal,
       activating a detection period signal in response to the reference count having a predetermined relationship to a reference count threshold, and
       generating a detection period reset signal that is synchronized to the operating clock signal.

2. The method of claim 1, wherein generating the operating count comprises
incrementing the operating count in response to each cycle of the operating clock signal, and
resetting the operating count in response to each detection period.

3. The method of claim 1, further comprising defining the detection period based upon a reference clock signal used to drive an input-output interface.

4. The method of claim 1, further comprising periodically activating a detection period reset signal based upon a reference clock signal, wherein generating the operating count comprises
updating the operating count in response to the operating clock signal, and
resetting the operating count in response to the detection period reset signal being activated.

5. The method of claim 1, further comprising
updating a reference count in response to a reference clock signal, and
activating a detection period reset signal in response to the reference count having a predetermined relationship to a threshold.

6. The method of claim 5, wherein generating the operating count comprises
updating the operating count in response to the operating clock signal, and
resetting the operating count in response to the detection period reset signal being activated.

7. An apparatus comprising
a detection period generator to define a plurality of detection periods based upon a reference clock signal,
an operating counter to generate an operating count for each detection period of the plurality of detection periods based upon an operating clock signal, and
an overclocking detector to activate an overclocking signal in response to the operating count having a predetermined relationship to a threshold,
wherein the detection period generator comprises:
a reference counter to generate a reference count based upon the reference clock signal,
a pulse generator to activate a detection period signal in response to the reference count having a predetermined relationship to a reference count threshold, and
a clock crossing circuit to generate a detection period reset signal that is synchronized to the operating clock signal.

8. The apparatus of claim 7, farther comprising
a clock drift filter to activate an overclocking response signal in response to the overclocking signal being activated in each of a predetermined number of consecutive detection periods.

9. The apparatus of claim 7, wherein the overclocking detector selects the threshold based upon select lines that define a frequency for the operating clock signal.

10. The apparatus of claim 7, wherein
the detection period generator defines the plurality of detection periods by activating a detection period reset signal for each detection period of the plurality of detection periods, and
the operating counter resets the operating count in response to the detection period reset signal being activated.

11. The apparatus of claim 7, wherein
the detection period generator comprises a reference counter that updates a reference count based upon the reference clock signal, and
the detection period generator activates the detection period reset signal based upon the reference count of the reference counter.

12. The apparatus of claim 7, wherein the pulse generator activates the detection period for at least two cycles of the operating clock signal.

13. A system comprising
a clock circuit to generate a reference clock signal and an operating clock signal,
a processor that operates based upon the operating clock signal, and
an overclock detector to define a plurality of detection periods based upon the reference clock signal, to generate an operating count for each detection period of the plurality of detection periods based upon the operating clock signal, and to activate an overclock response in response to the operating count having a predetermined relationship to a threshold in at least a predetermined number of consecutive detection periods,
wherein the overclock detector comprises:
a reference counter to generate a reference count based upon the reference clock signal,
a pulse generator to activate a detection period signal in response to the reference count having a predetermined relationship to a reference count threshold, and
a clock crossing circuit to generate a detection period reset signal that is synchronized to the operating clock signal.

14. The system of claim 13 further comprising an input-output interface that operates based upon the reference clock signal and that provides an interface to one or more devices.

15. The system of claim 13, wherein the overclock response comprises a system shutdown.

16. The system of claim 13, wherein the overclock response comprises a system reboot.

17. The system of claim 13, wherein the overelock response comprises throttling the processor.

18. The system of claim 13, wherein the overclock response comprising a halt of the processor.

* * * * *

UNITED STATES PATENT AND TRADEMARK OFFICE
CERTIFICATE OF CORRECTION

PATENT NO. : 7,321,978 B2
APPLICATION NO. : 11/014120
DATED : January 22, 2008
INVENTOR(S) : Brodsky Page 1 of 1

It is certified that error appears in the above-identified patent and that said Letters Patent is hereby corrected as shown below:

In column 9, line 49, in Claim 8, delete "farther" and insert -- further --, therefor.

In column 10, line 51, in Claim 17, delete "overelock" and insert -- overclock --, therefor.

Signed and Sealed this

First Day of July, 2008

JON W. DUDAS
*Director of the United States Patent and Trademark Office*